Figure 1:
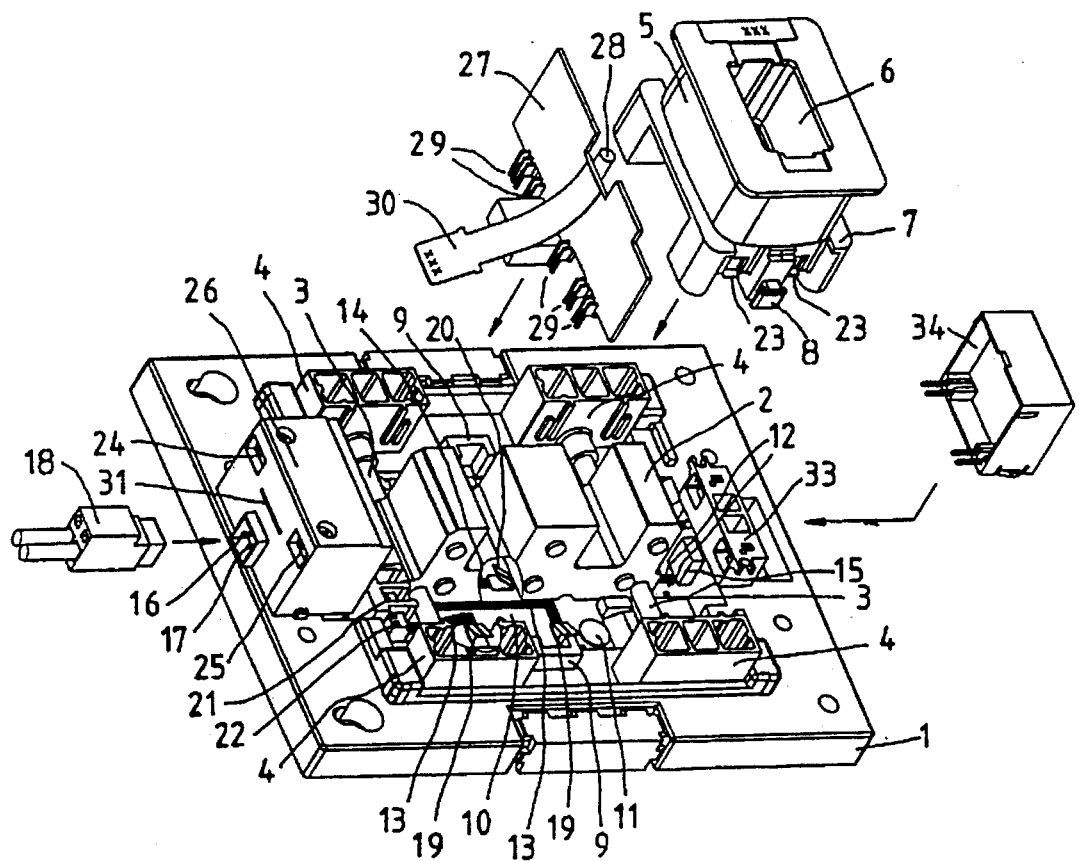

United States Patent [19]

Koller et al.

[11] Patent Number: 5,576,676

[45] Date of Patent: Nov. 19, 1996

[54] BASE PLATE MODULE FOR AN ELECTROMAGNETIC SWITCHING DEVICE SPECIFICALLY OF A CONTACTOR

[75] Inventors: Erich Koller, Othmarsingen AG; Hans Weichert, Graenichen AG; Daniel Zumkeller, Muenchwilen AG, all of Switzerland

[73] Assignee: Allen-Bradley Company, Inc., Milwaukee, Wis.

[21] Appl. No.: 592,825

[22] Filed: Jan. 26, 1996

[30] Foreign Application Priority Data

Mar. 25, 1995 [CH] Switzerland .................. 00850/95

[51] Int. Cl.⁶ .................................................. H01H 67/02
[52] U.S. Cl. ............................. 335/132; 335/202; 361/819
[58] Field of Search .................................. 335/132, 202; 361/819, 622, 627

[56] References Cited

U.S. PATENT DOCUMENTS

| | | | |
|---|---|---|---|
| 4,926,149 | 5/1990 | Saens et al. | 335/132 |
| 5,414,395 | 5/1995 | Garnto et al. | 335/202 |
| 5,483,213 | 1/1996 | Mueller et al. | 335/132 |

*Primary Examiner*—Lincoln Donovan
*Attorney, Agent, or Firm*—John M. Miller; John J. Horn

[57] ABSTRACT

The base plate module of an electromagnetic switching device, specifically a contactor, is mounted on a base plate (1). The base plate module contains the core (2) of the electromagnet, a magnet coil (5), a printed circuit board (10) with its connected ancillary devices, as well as the contact plugs (16, 17) and terminals (24, 25), both of which are accessible from the outside. Printed circuit board (10) is mounted on base plate (1) and is located between base plate (1) and core (2), which is mounted on the base plate. Strip conductors (12, 13, 14), on the side facing core (2), feature several spring-loaded stub contacts (19, 20) and/or contact plugs (21, 22), all of which are vertically mounted on circuit board (10). Flange (7) of coil module (6), which is oriented toward base plate (1), provided with terminals (23) of magnet coil (5). With magnet coil (5) in the mounted position, terminals (23) of magnet coil (5) are in contact with the spring-loaded stub contacts (19) of strip conductors (13). Contact plugs (21, 22) serve as receptacles for card (27) which contains electronic circuitry. All electrical connections in the base plate module are made by strip conductors (12, 13, 14) of printed circuit board (10).

8 Claims, 1 Drawing Sheet

BASE PLATE MODULE FOR AN ELECTROMAGNETIC SWITCHING DEVICE SPECIFICALLY OF A CONTACTOR

The present invention concerns a base plate module for an electromagnetic switching device, specifically that of a contactor, which comprises a base plate, the core of an electromagnet, which is mounted on the base plate module, also a magnet coil for energizing the electromagnet and a printed circuit board made primarily of electrically insulating material, which contains on at least one side, several strip conductors and which serves to provide electrical connections both within the base plate module and with base plate mounted terminals of the switching device which are externally accessible.

According to DE-A1-3045006, an electromagnetic switching device, featuring a base-plate mounted electromagnet and a magnet coil is known. This device is pluggable. Manufacture of this switching device involves soldering the individual contact plugs, the contact plugs of the switching device and the terminals of the magnetic coil to a long, flat, foil-type strip conductor. The foil-type strip conductor is subsequently folded, providing electrical wiring for the base plate mounted electrical switching device inside of its housing, and extending the soldered, protruding contact pins to the opposite side of the housing. The disadvantages of this switching device are the following: assembly of the device is relatively expensive because of the soldering procedure used, furthermore, any possible repairs on the device will involve labor intensive soldering work.

DE-A1-4406682 describes an additional electromagnetic switching device. The device is also equipped with an electromagnet and a magnet coil, among other items. The magnet coil terminals are fastened to a flange of the coil module. These magnet coil terminals are connected to the externally accessible coil plugs of the switching device by means of pluggable connectors. While the connectors between the magnet coil and the connector links are indeed pluggable, connection of any ancillary elements, e.g. a surge protection device, to the binding posts of the coil is relatively difficult. In addition, assembly of this switching device is encumbered with high costs due to the complicated connection links between the pluggable terminals of the magnetic coil and the externally accessible connections to the coil.

It is the objective of the present invention to propose a base plate module for an electromagnetic switching device which allows for simple assembly of both the magnet coil and the ancillary elements, with the added feature that any possible repairs of said device can be carried out in simple uncomplicated fashion and economically.

The desired objective is achieved by the fact that the strip conductors of the base-plate-mounted printed circuit board, which face the core, are provided with several vertically oriented spring-loaded stub contacts, and/or contact plugs, which provide connections to at least the flange-mounted terminals of the magnet coil. Assembly of this base plate module is uncomplicated, due to the fact that the magnet coil and any possible ancillary elements can either be connected to the spring-loaded stub contacts or are pluggable. Should any repairs be necessary, the defective parts can simply be changed by unplugging or detaching them. The simplified design of this base plate module also assures that it is economical.

The printed circuit board can be fastened to the base plate by means of plastic pegs. The plastic pegs, which are an integral part of the base plate, allow for simple mounting of the printed circuit board on the base plate.

The coil terminals of the magnet coil are advantageously held in the engaged position with the strip contacts by the coil module mounting device. A simple mounting device can, for instance, be provided by the additional housing components which abut the base plate module. A further advantage to the secure positioning of the coil module is provided by the frictional resistance in the base plate, which provides for retention of the coil module in the base plate even after removal of the holding device. This additional mounting support allows for removal of the operative holding device of the coil module, without causing the coil module to fall out when the base plate module is in the vertical position.

The plug contacts on the circuit board can be sockets which are designed to accept contact pins from at least one card module containing electronic circuitry. This solution allows for simple insertion of an optional card module with electronic circuitry as an ancillary device.

The strip conductors are provided with externally accessible terminals, which are advantageously fixed in a tiltable connector box by means of flexible connections. The dimensions of the switching device can be kept relatively small when the connector-box is tilted out of the way during assembly; this is because the terminals are readily accessible despite cramped conditions. The tiltable connector box can advantageously display a slit for a protruding strip which is attached to the card module, which can be read from the outside and which carries information pertaining to the ancillary elements (e.g. electronic circuitry). This can be done without having to open the device's housing.

A spring-loaded stub contact, which is connected to the strip conductor, is in electrical contact with the core mounted on the base plate. This contact allows for establishing an interference-suppressing connection between the core of the electromagnet and any electrically connected circuitry of the printed circuit board. Such an interference suppressing connection serves to reduce any observed interference effects of the switching device on external control circuits.

The following is a closer description of an example of implementation of the invention. The drawings contain:

FIG. 1 a three-dimensional, partly enlarged, representation of the base-plate module of an electronic switching device.

Figure 2:
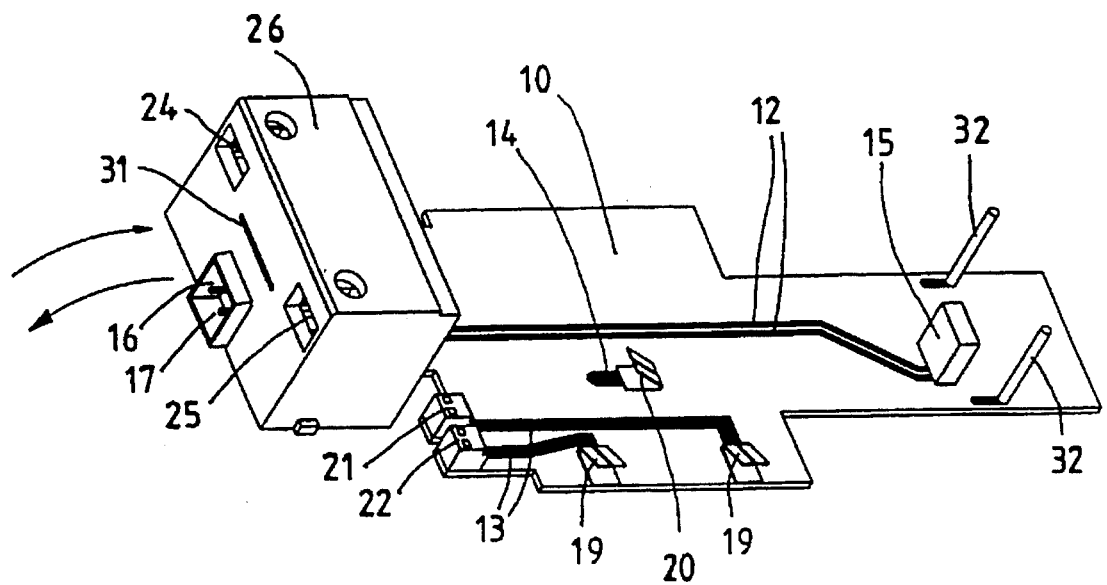

FIG. 2 a three-dimensional representation of the printed circuit board installed in the base-plate module (shown somewhat enlarged).

FIG. 1 contains a three-dimensional, partly enlarged drawing of the base plate module of an electronic switching device. The base plate module is mounted on a base plate 1. In this specific case of implementation of a contractor, the core 2 of the electromagnet of the electromagnetic switching device is secured to the integral base-plate elements 4 by means of two pegs 3. During assembly, magnet coil 5 and coil module 6, which serve to actuate the electromagnet (shown in enlarged form), slip onto the central leg of core 2. At the lower flange 7 of coil module 6 two projecting parts 8, equipped with rubber rings, are present on each side. Projecting parts 8 fit into grooves 9, which are integral components of base plate 1. After mounting magnet coil 5 a friction-tight connection exists between the rubber-ring-equipped projecting parts 8 and grooves 9. This friction-tight connection secures magnet coil 5 in a vertical position, even after the removal of the operative holding device for magnet coil 5 (not included in drawing). The operative holding device (not shown here) for magnet coil 5 is provided by the upper housing cover of the switching device which abuts coil module 6. The friction-tight connection between coil module 6 and base plate 1 prevents magnet coil 5 from becoming dislodged from base plate 1 during an exchange of coils, or replacement of any other component of the switching device, after removal of the upper housing cover.

The printed circuit board 10, shown somewhat enlarged in FIG. 2, is fastened to base plate 1 by means of plastic pegs 11, which are integral parts of base plate 1, between core 2 and base plate 1. Printed circuit board 10 carries several strip conductors 12, 13, 14 on both sides. The manufacture of printed circuit boards is state of the art, requiring no further description at this point. Strip conductors 12, 13, 14 are located on the surface of circuit board 10, which consists mainly of electrically insulating material. The two tracks of strip conductor 12 are connected to an interface module 15, which is fastened to circuit board 10. Interface module 15 allows for triggering of the switching device through electronic circuitry which can be plugged into printed circuit board 10. Connections between these contact jacks featured on circuit board 10 and interface module 15 are made by means of several tracks which are not visible in the figures, since they are located on the opposite side of circuit board 10. The opposite ends of tracks 12 are electrically connected through flexible electrical connectors with the externally accessible contact plugs 16, 17.

Interface module 15 is connected to the outside with plug 18. Different types of interface modules, e.g. optical units, can also be employed, using the respective terminals and connections.

Strip conductors 13, 14 are provided with spring-loaded stub contacts 19, 20 and contact plugs 21, 22; all of these are vertically oriented on circuit board 10 and located on the side facing core 2. Spring-loaded stub contact 20 makes electrical contact with core 2 at the side which is oriented towards base plate 1. Strip conductor 14, which is connected to spring-loaded stub contact 20, connects mounted core 2 with circuitry connected to the plugs, either by direct connection or via condensers. At least at higher frequencies, it constitutes an effective interference elimination device between these components. This interference-elimination connection aids in reducing the observed interference by the switching device on external control circuitry.

Terminals 23 of magnet coil 5 are attached to flange 7 of coil module 6. With coil module 6 installed, terminals 23 are electrically connected with spring-loaded stub contacts 19. Magnet coil 5 is electrically supplied via strip conductors 13. The externally accessible terminals 24, 25 of magnet coil 5 are mounted in tiltable connector box 26 by means of flexible connections. Connector box 26 is tilted away from base plate 1 during assembly of the base plate module of the switching device, and the connections to magnet coil 5 and interface module 15 are soldered from behind. Tiltable connector box 26 makes it possible to reduce the over all dimensions of the switching device. During assembly, accessibility to the soldered connections in the connector box 26 (which will have been tilted away) does not require extra space and, therefore, does not increase the over-all dimensions of the switching device.

Card 27 contains electronic circuitry for controlling the energizing current provided to magnet coil 5. The energizing current is controlled in relation to the air gap of the electromagnet. For this purpose, card 27 carries a magnetic sensor 28 which affects the energizing current. Such circuitry is described in this applicant's Swiss Patent Application (No. 00374/95-6 of Feb. 9, 1995). Card 27 is provided with contact pins 29 which can be plugged into female plugs 21, 22 of printed circuit 10, providing contact with the respective strip conductors. The figures do not show all available female plugs, some are blocked out by connector box 26. Electrical supply of magnet coil 5 proceeds via female plugs 24, 25 to the strip conductors of printed circuit 10, then via the circuitry of plugged-in card 27 to strip conductors 13, and finally, via spring-loaded stub contacts 19 to terminals 23 of magnet coil 5, which is mounted on the middle leg of core 2, installed on base plate 1.

Card 27 carries a flexible strip 30. The tip of strip 30 carries identification information about the electronic circuitry present on card 27. With card 27 mounted in the plugs, the tip of this strip is slipped through slit 31 in connector box 26. Once the switching device is completely assembled, the tip of strip 30 protrudes from slit 31, allowing ready external access to the identifying information of the specific circuitry employed, without having to open the housing.

The strip conductors extend under printed circuit board 10 to the two connection pins 32 which project vertically from circuit board 10, as shown in FIG. 2. Connector pins 32 provide contact to an overvoltage suppressor 34, preferably consisting of a voltage-dependent resistor. This device can be connected via module 33, as shown in FIG. 1. This excess voltage suppressor 34 is thus electrically connected to terminals 24, 25 of magnet coil 5.

We claim:

1. The base-plate module of an electromagnetic switching device, specifically that of a contactor, consisting of a base plate, the core of an electromagnet which is installed in said base plate module, a magnet coil for activating the electromagnet, and a printed circuit board consisting mainly of electrically insulating material, where said printed circuit board provides electrical connections between the terminals in the base-plate module and the externally accessible terminals of the switching device, and where said base plate module contains, at least on one side, several strip conductors and is characterized in that strip conductors (12, 13, 14), at the side facing core (2) of circuit board (10), which is mounted on base plate (1), feature several spring-loaded stub contacts (19, 20) and/or contact plugs (21, 22), all of which are oriented vertically to circuit board (10), and where said strip conductors are connected at least to terminals (23) of magnet coil (5), which are installed on flange (7) of coil module (6).

2. Base plate module according to claim 1, characterized in that printed circuit board (10) is mounted on base plate (1) by means of plastic pegs (11).

3. Base plate module according to claim 1, characterized in that terminals (23) of magnet coil (5), which are installed on coil module (6), are held in the engaged position with the spring-loaded stub contacts (19) of strip conductors (13) by means of the holding device of coil module (6).

4. Base plate module according to claim 3, characterized in that coil module (6) is in addition kept secure in base plate (1) of the base plate module by a friction-tight fit, so that after removal of the holding device for coil module (6) it remains securely seated in base plate (1).

5. Base plate module according to claim 1, characterized in that contact plugs (21, 22), located on printed circuit board (10) are female plugs, designed to receive contact pins (29) of at least one card (27) which contains electronic circuitry.

6. Base plate module according to claim 1, characterized in that strip conductors (12, 13) feature externally accessible terminals (16, 17, 24, 25), which are located in a tiltable connector box (26), and are connected by means of flexible connections.

7. Base plate module according to claims 5 and 6, characterized by the fact that the tiltable connector box (26)

features a slit (31), through which a strip (30) protrudes, and where said strip carries externally legible information about the electronic circuitry of card (27) to which it is connected.

8. Base plate module according to claim 1, characterized in that a spring-loaded stub contact (20), which is connected to a strip conductor (14) is in electrical contact with the properly installed core (2) in the base plate module.

* * * * *